United States Patent

Arase et al.

[11] Patent Number: 5,814,855
[45] Date of Patent: Sep. 29, 1998

[54] NONVOLATILE MEMORY DEVICE AND METHOD OF MANUFACTURING SAME

[75] Inventors: Kenshiro Arase; Koichi Maari, both of Kanagawa, Japan

[73] Assignee: Sony Corporation, Japan

[21] Appl. No.: 767,411

[22] Filed: Dec. 16, 1996

Related U.S. Application Data

[63] Continuation of Ser. No. 321,911, Oct. 12, 1994, abandoned.

[30] Foreign Application Priority Data

Oct. 15, 1993 [JP] Japan ..................................... 5-258711
Oct. 22, 1993 [JP] Japan ..................................... 5-264639

[51] Int. Cl.⁶ ...................................................... H01L 29/68
[52] U.S. Cl. .......................... 257/315; 257/317; 257/322
[58] Field of Search ..................................... 257/314–326

[56] References Cited

U.S. PATENT DOCUMENTS 4,282,446   8/1981   McElroy .
5,424,567   6/1995   Chen ........................................ 257/315
5,479,368  12/1995   Keshtbod ................................. 257/316

FOREIGN PATENT DOCUMENTS 56-035472   4/1981   European Pat. Off. .
58-220464  12/1983   European Pat. Off. .
0369676    5/1990    European Pat. Off. .
2226184    6/1990    United Kingdom .
2226697    7/1990    United Kingdom .

Primary Examiner—Donald Monin
Attorney, Agent, or Firm—Ronald P. Kananen

[57] ABSTRACT

In a flash type EEPROM device, when a dose amount of an impurity of a floating gate is controlled, or, a channel of a transistor is buried by an ion implantation, the threshold value at no charges accumulated is set between the threshold at writing and the threshold at erasure, to reduce the disturbances of a drain and a gate when reading.

5 Claims, 8 Drawing Sheets

| SELECTED GATE LINES SG1, SG2 | SELECTED WORD LINE WL4 | NONSELECTED WORD LINES WL1~3, 5~8 | SELECTED BIT LINE BLN | NONSELECTED BIT LINES BLN-1, BLN+1 |
|---|---|---|---|---|
| 5V | 0V | 5V | 3V | 0V |

| SELECTED WORD LINE [WLM] | NONSELECTED WORD LINES [WLM-1, WLM+1] | SELECTED BIT LINE [BLDN] | NONSELECTED BIT LINES [BLSN-1~BLSN+1] [BLDN-1, BLDN+1] |
|---|---|---|---|
| 12V | 0V | 7V | 0V |

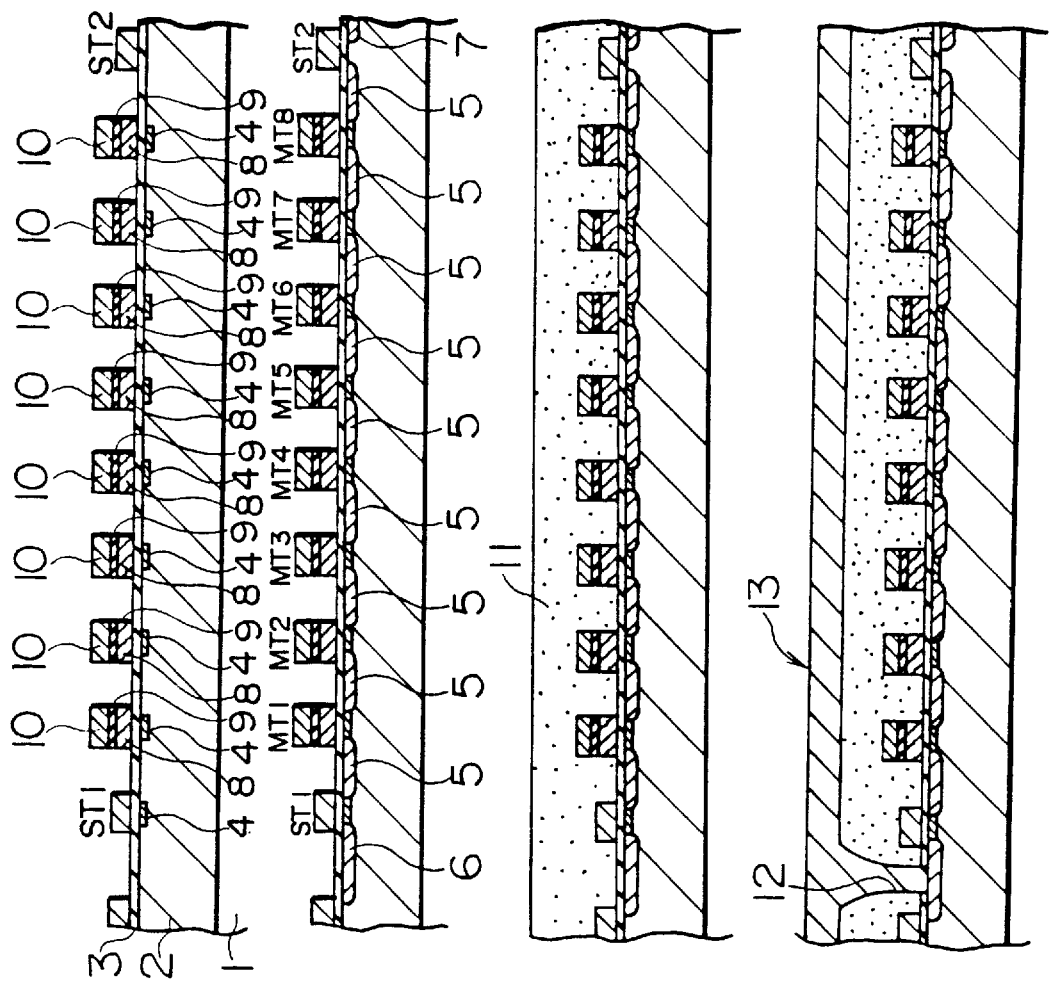

NONVOLATILE MEMORY DEVICE AND METHOD OF MANUFACTURING SAME

This application is a continuation of application Ser. No. 08/321,911 filed Oct. 12, 1994, now abandoned.

BACKGROUND OF THE INVENTION

1. Field of the Invention

The present invention relates to an electrically erasable nonvolatile memory, for example, a flash EEPROM or other semiconductor nonvolatile memory device, and a method of manufacturing the same.

2. Description of the Related Art

FIG. 1 is a circuit diagram showing an example of a memory cell array of a NAND type flash EEPROM and showing the bias conditions at the time of a reading operation.

In FIG. 1, $BL_{N-1}$, $BL_N$, and $BL_{N+1}$ denote bit lines, $V_{SS}$ denotes a source line, $WL_1$ to $WL_8$ denote word lines, $SG_1$ to $SG_2$ denote selection gate lines, $ST1_{N-1}$, $ST1_N$, $ST1_{N+1}$, $ST2_{N-1}$, $ST2_N$, and $ST2_{N+1}$ denote selection gates, $MT1_{N-1}$ to $MT8_{N-3}$, $MT1_N$ to $MT8_N$, and $MT1_{N+1}$ to $MT8_{N+1}$ denote memory cell transistors, CG denotes control gates of the memory cells, and FG denote floating gates of the memory cells.

In the memory cell array, one end of each of the bit lines $BL_{N-1}$, $BL_N$, and $BL_{N+1}$ is connected to a common source line $V_{SS}$. Between the source line $V_{SS}$ and each of the other ends of the bit lines $BL_{N-1}$, $BL_N$, and $BL_{N+1}$ are connected the selection gates $ST1_{N-1}$, $ST1_N$, and $ST1_{N+1}$ and $ST2_{N-1}$, $ST2_N$, and $ST2_{N1}$, respectively. Further, between the selection gates $ST1_{N-1}$ and $ST2_{N-1}$, between the selection gates $ST1_N$ and $ST2_N$, and between the selection gates $ST1_{N+1}$ and $ST2_{N+1}$ are connected eight series-connected memory cell transistors $MT1_{N-1}$ to $MT8_{N-1}$, $MT1_N$ to $MT8_N$, and $MT1_{N+1}$ to $MT8_{N+1}$, respectively.

The gates of the selection gates $ST1_{N-1}$, $ST1_N$, and $ST1_{N+1}$ are connected to a common selection gate line $SG_1$, while the gates of the selection gates $ST2_{N-1}$, $ST2_N$, and $ST2_{N+1}$ are connected to a common selection gate line $SG_2$.

The control gates CG of the memory cell transistors $MT1_{N-1}$, $MT1_N$, and $MT1_{N+1}$ are connected to a common word line $WL_1$.

Similarly, the control gates CG of the memory cell transistors $MT2_{N-1}$, $MT2_N$, and $MT2_{N+1}$ are connected to a common word line $WL_2$, the control gates CG of the memory cell transistors $MT3_{N-1}$, $MT3_N$, and $MT3_{N+1}$ are connected to a common word line $WL_3$, the control gates CG of the memory cell transistors $MT4_{N-1}$, $MT4_N$, and $MT4_{N+1}$ are connected to a common word line $WL_4$, the control gates CG of the memory cell transistors $MT5_{N-1}$, $MT5_N$, and $MT5_{N+1}$ are connected to a common word line $WL_5$, the control gates CG of the memory cell transistors $MT6_{N-1}$, $MT6_N$, and $MT6_{N+1}$ are connected to a common word line $WL_6$, the control gates CG of the memory cell transistors $MT7_{N-1}$, $MT7_N$, and $MT7_{N-1}$ are connected to a common word line $WL_7$, and the control gates CG of the memory cell transistors $MT8_{N-1}$, $MT8_N$, and $MT8_{N+1}$ are connected to a common word line $WL_8$.

In such a configuration, when reading out data, for example, as shown in FIG. 1, when an N-th bit line $BL_N$ is selected and the word line $WL_4$ is selected, the selection gates $SG_1$ and $SG_2$, the selected word line $WL_4$, the nonselected word lines $WL_1$ to $WL_3$ and $WL_5$ to $WL_8$, the selected bit line $BL_4$, and the nonselected bit lines $BL_{N-1}$ and $BL_{N+1}$ are biased to the levels as shown in FIG. 1 and FIG. 2.

Namely, the selection gates $SG_1$ and $SG_2$ are set to 5 V, the selected word line $WL_4$ to 0 V, the nonselected word lines $WL_1$ to $WL_3$ and $WL_5$ to $WL_8$ to 5 V, the selected bit line $BL_N$ to 3 V, and the nonselected bit lines $BL_{N-1}$ and $BL_{N+1}$ to 0 V.

In a memory cell of an NAND type flash EEPRON, the threshold voltages $V_{th0}$ and $V_{th1}$ at the time when the data is "0" and "1" are usually as follows:

The threshold voltage $V_{th0}$ at the time of the data "0" when there is no charge present in the floating gate FG is about 1 to 2 V.

On the other hand, the threshold voltage $V_{th1}$ at the time of the data "1" when there is a positive charge present in the floating gate FG is about −2 to −3 V.

Here, at the time of reading data, since a memory cell of the data "1" has a positive charge (state where electrons are withdrawn) in the floating gate FG in this way, the potential of the floating gate FG shifts to the positive side by 3 to 5 V corresponding to the amount of the difference of the threshold voltage $\Delta V_{th}$ at the time of the data "0".

This will be explained below using equations.

In the case of a read operation of an NAND type flash EEPROM, the potential $V_{FG}$ of the floating gate at a cell where the source-drain potential has fallen below 1 V whether a memory cell of a nonselected bit line or a memory cell of a selected bit line, is expressed by the following equation:

$$V_{FG} = \alpha \cdot V_{WL} + \alpha (V_{THINIT} - V_{TH}) \tag{1}$$

Where,

α is a coupling ratio (0.6 to 0.7), $V_{WL}$ is the word line voltage, $V_{THINIT}$ is the threshold voltage when there is no charge in the floating gate FG, that is, at the time of erasure by ultraviolet light, and $V_{TH}$ is the threshold voltage of the memory cell.

Usually, in an NAND type flash EEPROM, the threshold voltage $V_{THINIT}$ at the time of erasure by ultraviolet light is the data "0" state or about 1 to 2 V. A memory cell of the data "1" has a positive charge in the floating gate FG, so the threshold voltage $V_{TH}$ is set to −2 V to −3 V.

However, a floating gate of a memory cell of the data "1" on a nonselected word line is supplied with not only the word line potential of the first term of equation (1) mentioned above, but also a positive voltage due to the second term, so a strong electric field is applied to the so-called tunnel oxide film. Accordingly, by continuing the read operation for a long period, in some cases electrons are injected into the floating gate by the Fowler-Nordheim (FN) tunneling effect and a memory cell of the data "1" is changed to the data "0", that is, there is the problem of occurrence of a so-called reading gate disturbance.

Next, a NOR type EEPROM will be described.

In the past, in a nonvolatile memory wherein data is written by injection of electrons in a floating gate by channel hot electrons, for example, an ultraviolet light erasable EEPROM or CHE writable/FN erasable flash EEPROX, the selected word line is set to 10 V to 20 V, the nonselected word lines to 0 V, the selected bit line to 5 V to 8 V, and the nonselected bit lines to 0 V at the time of writing data.

FIG. 3 is a circuit diagram showing an example of a memory cell array of a NOR type flash EEPROM and showing the bias conditions at the time of writing by injection of channel hot electrons (CHE).

In FIG. 3, $BLS_{N-1}$, $BLS_N$, $BLS_{N+1}$, represent source lines and $BLD_{N-1}$, $BLD_N$, and $BLD_{N+1}$ represent bit lines, $WL_{M-1}$, $WL_M$, and $WL_{M+1}$ represent word lines, $MT_{11}$ to $MT_{33}$ represent memory cell transistors, CG represents a control gate of the memory cell, and FG represents a floating gate of the memory cell.

In the memory cell array, the control gates CG of the memory cell transistors $MT_{11}$ to $MT_{13}$ are connected to the word line $WL_{M-1}$, the control gates CG of the memory cell transistors $MT_{21}$ to $MT_{23}$ are connected to the word line $WL_M$, and the control gates CG of the memory cell transistors $MT_{31}$ to $MT_{33}$ are connected to the word line $WL_{M+1}$.

Further, the sources/drains of the memory cell transistors $MT_{11}$, $MT_{21}$, and $MT_{31}$ are connected to the source lines $BLS_{N-1}$ and bit lines $BLD_{N-1}$, the sources/drains of the memory cell transistors $MT_{12}$, $MT_{22}$, and $MT_{32}$ are connected to the source lines $BLS_N$ and bit lines $BLD_N$, and the sources/drains of the memory cell transistors $MT_{13}$, $MT_{23}$, and $MT_{33}$ are connected to the source lines $BLS_{N+1}$ and bit lines $BLD_{N+1}$.

In such a configuration, when injecting channel hot electrons for writing, for example, as shown in FIG. 3, when an N-th bit line $BLD_N$ is selected and the M-th word line $WL_M$ is selected, the selected word line $WL_M$, the nonselected word lines $WL_{M-1}$ and $WL_{M+1}$, the selected bit line $BLD_N$, and the nonselected bit lines, $BLS_N$, $BLD_{N-1}$, and $BLD_{N+1}$ and source lines $BLS_{N-1}$, $BLS_N$, $BLS_{N+1}$ are biased to the levels as shown in FIG. 3 and FIG. 4.

Namely, the selected word line $WL_M$ is set to 12 V, the nonselected word lines $WL_{M-1}$ and $WL_{M+1}$ to 0 V, the selected bit line $BLD_N$ to 7 V, and the nonselected bit lines, $BLD_{N-1}$, and $BLD_{N+1}$ to 0 V and source lines $BLS_{N-1}$, $BLS_N$, $BLS_{N+1}$ to 0 V.

In a memory cell, the threshold voltages $V_{th0}$ and $V_{th1}$ at the time when the data is "0" and "1" are usually as follows:

The threshold voltage $V_{th0}$ at the time of the data "0" when there is no charge present in the floating gate FG is about 1 to 2 V.

On the other hand, the threshold voltage $V_{th1}$ at the time of the data "1" when there is negative charge present in the floating gate FG is at least 5 V.

At the time of writing data, since a memory cell of the data "1" has a negative charge (electrons) in the floating gate FG in this way, the potential of the floating gate FG shifts to the negative side by 3 to 4 V corresponding to the amount of the difference of the threshold voltage $\Delta V_{th}$ at the time of the data "0".

This will be explained below using equations.

The potential $V_{FG}$ of the floating gate at a memory cell on a selected bit line and nonselected word line at the time of writing data by channel hot electrons is expressed by the following equation:

$$V_{FG} = \alpha D \cdot V_{BL} + \alpha (V_{THINIT} - V_{TH}) \quad (2)$$

Where, a is a coupling ratio (0.6 to 0.7),

αD is a drain coupling ratio (0.1), $V_{BL}$ is the bit line voltage, $V_{THINIT}$ is the threshold voltage when there is no charge in the floating gate FG, that is, at the time of erasure by ultraviolet light, and $V_{TH}$ is the threshold voltage of the memory cell.

From this equation (2), the potential difference $V_{FD}$ between the drain and floating gate is expressed by the following equation:

$$V_{FD} = (1-\alpha D) \cdot V_{BL} + \alpha (V_{TH} \cdot V_{THINIT}) \quad (3)$$

Usually, in an NOR type flash EEPROM, the threshold voltage $V_{THINIT}$ at the time of erasure by ultraviolet light is the data "0" state or about 1 to 2 V. A memory cell of the data "1" has electrons in the floating gate FG, so the threshold voltage $V_{TH}$ is set to at least 5 V.

However, a floating gate of a memory cell of the data "1" on the selected bit line and nonselected word line is supplied with not only the bit line potential of the first term of equation (2) mentioned above, but also a positive voltage due to the second term, so a strong electric field is applied to the so-called tunnel oxide film between the drain and floating gate at the time of writing data.

Accordingly, when writing data, in some cases electrons are withdrawn from the floating gate by the Fowler-Nordheim (FN) tunneling effect and a memory cell of the data "1" is changed to the data "0", that is, there is the problem of occurrence of a so-called write drain disturbance.

SUMMARY OF THE INVENTION

An object of the present invention is to provide a semiconductor nonvolatile memory device which can prevent the occurrence of read gate disturbances at the time of reading data, and a method for producing the same.

Another object of the present invention is to provide a semiconductor nonvolatile memory device which can prevent the occurrence of write drain disturbances at the time of writing data, and a method of producing the same.

To achieve the above first object, the present invention provides an NAND type semiconductor nonvolatile memory device wherein the threshold value of a memory cell transistor changes in accordance with the state of storage of a charge in the floating gate, wherein the threshold value at a state where no charge is stored in the floating gate is between a threshold value at a time of a writing state and a threshold value at a time of an erasure state.

Further, in the present invention, the channel of the memory cell transistor has a buried channel structure comprised of a first conductivity type channel portion in which a second conductivity type impurity is implanted.

According to the present invention, when the threshold value of the data "0" where negative charge is present in the floating gate is about 1 to 2 V and the threshold voltage of the data "1" where a positive charge is present in the floating gate is about -2 to -3 V, the threshold voltage in the state with no charge in the floating gate is set to -0 to -1 V, between the data "0" and "1", by for example using a buried channel structure in which the channel of the memory cell transistor is made a first conductivity type (for example, P type) channel and is implanted with a second conductivity type (for example N type) impurity.

In this way, by setting the threshold voltage at the time of the state of erasure by ultraviolet light to a low 0 to -1 V or so, the amount of the positive charge at the data "1" state is greatly reduced.

As a result, there is no longer a strong electric field applied to the tunnel oxide film and the read gate disturbance at the time of reading of data is greatly mitigated.

To achieve the above second object, the present invention provides an NOR type semiconductor nonvolatile memory device wherein the threshold value of a memory cell transistor changes in accordance with the state of storage of a charge in the floating gate, wherein the threshold value at a state where no charge is stored in the floating gate is between a threshold value at a time of a writing state and a threshold value at a time of an erasure state.

Further, in the present invention, the charge storage portion is a floating gate to which a P-type impurity has been added.

According to the present invention, when the threshold value of the data "0" where positive charge is present in the floating gate is about 1 to 2 V and the threshold voltage of the data "1" where a negative charge is present in the floating gate is at least 5 V, the threshold voltage in the state with no charge in the floating gate is set to 2 to 3 V, between the data "0" and "1", by for example adding a P-type impurity to the floating gate of the memory cell transistor.

In this way, by setting the threshold voltage at the time of the state of erasure by ultraviolet light to a high 2 to 3 V or so, the amount of the negative charge (electrons) at the data "1" state is greatly reduced.

As a result, there is no longer a strong electric field applied to the tunnel oxide film and the writing gate disturbance at the time of writing of data is greatly mitigated.

BRIEF DESCRIPTION OF THE DRAWINGS

These and other objects and features of the present invention will become clearer from the following description of preferred embodiments with reference to the accompanying drawings, in which:

FIGS. 6A to 6I are an explanatory views of the process of production of a NAND type flash EEPROM according to the present invention;

DETAILED DESCRIPTION OF THE PREFERRED EMBODIMENTS

Preferred embodiments of the present invention will be described with reference to the accompanying drawings.

Figure 5:
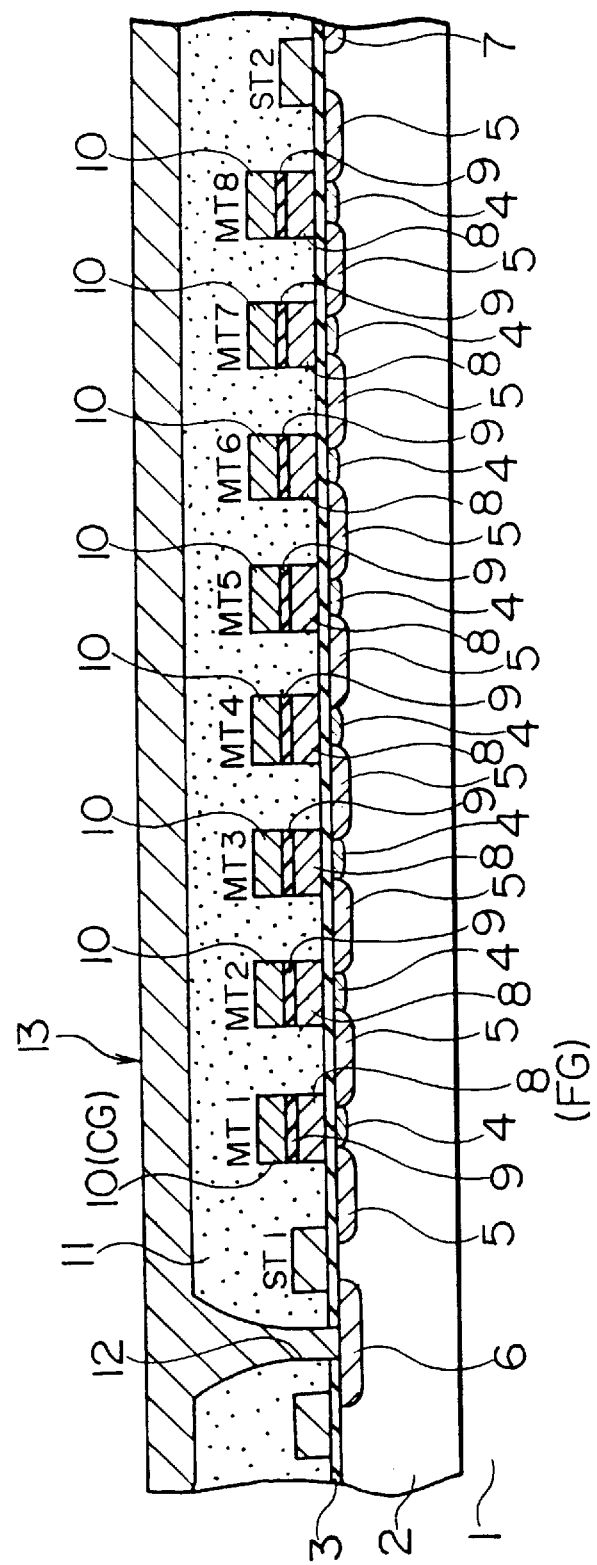
FIG. 5 is a cross-sectional view of a first embodiment of a NAND type flash EEPROM according to the present invention.

FIG. 5 is a cross-sectional view of a first embodiment as an NAND type flash EEPROM according to the present invention. The figure shows a memory cell structure connected to the N-th bit line $BL_N$ in the memory array of FIGS. 6A to 6I.

In FIG. 5, 1 represents a silicon substrate, 2 represents a P-type well, 3 represents a tunnel oxide film, 4 represents a buried channel structure, 5 represents a diffusion layer, 6 represents a bit diffusion layer, 7 represents a source diffusion layer, 8 represents a floating gate polycrystalline silicon layer, 9 represents an intermediate insulating film, 10 represents a control gate polycrystalline silicon layer, 11 represents a layer insulating film, 12 represents a bit line contact hole, and 13 represents an aluminum (Al) bit line.

In this flash EEPROM, an N-type impurity, for example, phosphorus or arsenic, is ion implanted at the P-type channel formation region of the memory cell transistors to form a low concentration N-type layer, that is, the buried channel layer 4, and lower the threshold voltage $V_{THINIT}$ of the state with no charge present in the floating gate FG from the conventional 1 to 2 V to set it at 0 to -1 V.

The threshold voltage $V_{th0}$ at the time of the data "0" where negative charge is present in the floating gate FG of a memory cell is 1 to 2 V or so. On the other hand, the threshold voltage $V_{th1}$ at the time of the data "1" where a positive charge is present in the floating gate FG is -2 to -3 V or so.

In this memory cell, the threshold voltage $V_{THINIT}$ in the state with no charge present in the floating gate is set, as shown below, between the threshold voltage $V_{th0}$ of the time of the data "0" where negative charge is present in the floating gate FG and the threshold voltage $V_{th1}$ at the time of the data "1" where a positive charge is present in the floating gate FG:

$$V_{th1} < V_{THINIT} < V_{th0}$$

In this way, by setting low the threshold voltage $V_{TNINIT}$ at the time of the state of erasure by ultraviolet light to a depletion state (negative) from 0 V, the amount of the positive charge at the state of the data "1" is greatly reduced. As a result, the second term $[\alpha(V_{THINIT} - V_{TH})]$ in equation (1) mentioned above becomes much smaller and the read gate disturbance at the time of reading data is greatly mitigated.

Next, an explanation will be made of the method of production of an NAND type flash EEPROM according to the present embodiment with reference to FIGS. 6A to 6I.

Figure 6A:
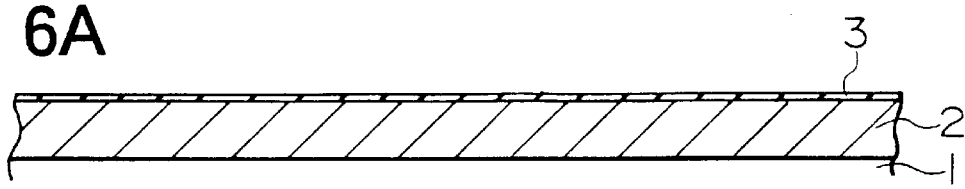

First, as shown in FIG. 6A, a P-type well diffusion layer 2 of the memory portion is formed on the silicon substrate 1, then a tunnel oxide film 3 of a thickness of 10 to 11 nm or so is formed by the thermal oxidation method etc.

Figure 6B:
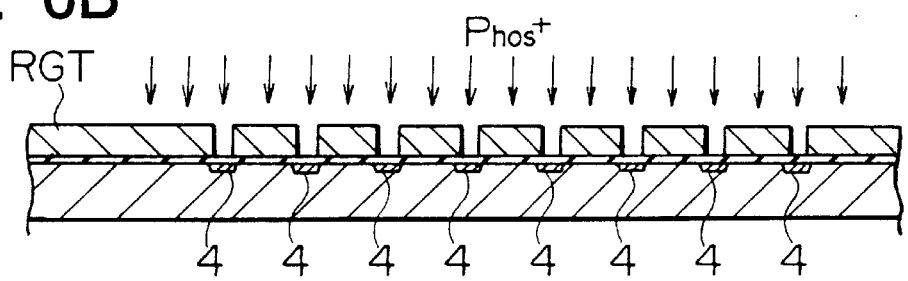

Next, as shown in FIG. 6B, a resist pattern RGT is formed at the channel formation portions of the memory cell transistors and phosphorus+ (P+) ions (or arsenic+ (As+) ions) are implanted by for example 50 kev to $10^{12}$ to $5 \times 10^{12}$ cm$^{-2}$ or so to form low concentration N-type layers, that is, buried channel layers 4, at the channel portions of the memory cell transistors.

Figure 6C:
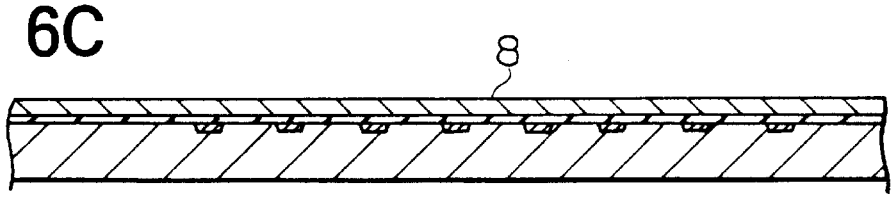

Next, the resist pattern is removed, then, as shown in FIG. 6C, a floating gate polycrystalline silicon layer 8 for forming the floating gates FG is formed on the tunnel oxide film 3 using polycrystalline silicon by for example the CVD method. The thickness of this floating gate polycrystalline silicon layer 8 is not particularly limited, but for example may be set to 100 to 200 nm or so.

Next, the floating gate polycrystalline silicon layer 8 is etched by a pattern corresponding to the memory cell formation regions to remove the portions of the floating gate polycrystalline silicon layer 8 at regions where the selection gate transistors ST1 and ST2 are to be formed.

Figure 6D:
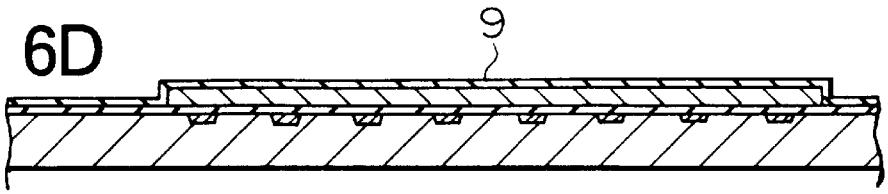

Next, as shown in FIG. 6D the intermediate insulating film 9 is deposited on top. The intermediate insulating film 9 is not particularly limited, but for example use may be made of an ONO film ($SiO_2/SiN/SiO_2$ film). The ONO film is formed for example as follows:

First, the surface of the floating gate polycrystalline silicon layer 8 is heat oxidized to form an oxide film of not more than 14 nm or so. On this heat oxidized film is formed a silicon nitride film of not more than about 11 nm by the CVD method etc. This surface is heat oxidized to form an oxide film of not more than about 2 nm. By this processing, it is possible to form a three-layer structure ONO film. This ONO film is low in leakage current and superior in film thickness control. The thickness of the ONO film is not more than 22 nm or so converted to a silicon oxide film.

Figure 6E:
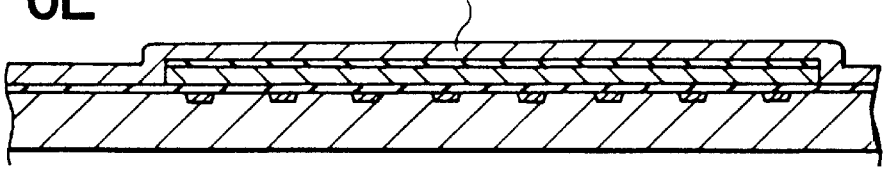

Next, as shown in FIG. 6E, just the portions of the intermediate insulating film 9 in the regions where the selection gate transistors ST1 and ST2 are to be formed are selectively removed, then a control gate polycrystalline silicon layer 10 for forming the control gates CG of the memory cell transistors and the gate electrodes of the selection gate transistors is formed on the tunnel oxide film 3 and intermediate insulating film 9 using polycrystalline silicon and for example the CVD method. The thickness of this control gate polycrystalline silicon layer 10 is not particularly limited, but for example is set to not more than 200 nm.

Next, as shown in FIG. 6F, the control gate polycrystalline silicon layer 10, the intermediate insulating film 9, and the floating gate polycrystalline silicon layer 8 are successively etched to obtain the portions of the control gate polycrystalline silicon layer 10, the intermediate insulating film 9, and the floating gate polycrystalline silicon layer 8 for each of the memory cells MT1 to MT8. Further, at the same time, the gates of the selection gate transistors ST1 and ST2 are formed.

Next, as shown in FIG. 6G, use is made of the resist film (not shown) at the time of etching for N-type ion implantation on the surface of the P-type well 2 in a self-alignment manner with the memory cell transistors MT1 to MT8 and the selection gate transistors ST1 and ST2 and thereby form the impurity diffusion layers 5, 6, and 7.

Next, as shown in FIG. 6H, a layer insulating film 11 is deposited by the CVD method or the like on the memory cell transistors MT1 to MT8 and the selection gate transistors ST1 and ST2. The layer insulating film 11 is comprised of for example a silicon oxide layer, silicon nitride layer, PSG layer, BPSG layer, etc. The thickness of the layer insulating film 11 is not particularly limited, but for example may be 200 to 300 nm.

Next, as shown in FIG. 6I, the bit line contact holes 12 are formed in the layer insulating film 11 by etching or other means, then a conductive layer comprised of aluminum (Al) is deposited by sputtering etc. so as to enter into the contact holes 12.

Next, the conductive layer is etched to form the aluminum bit lines 13.

Figure 1:
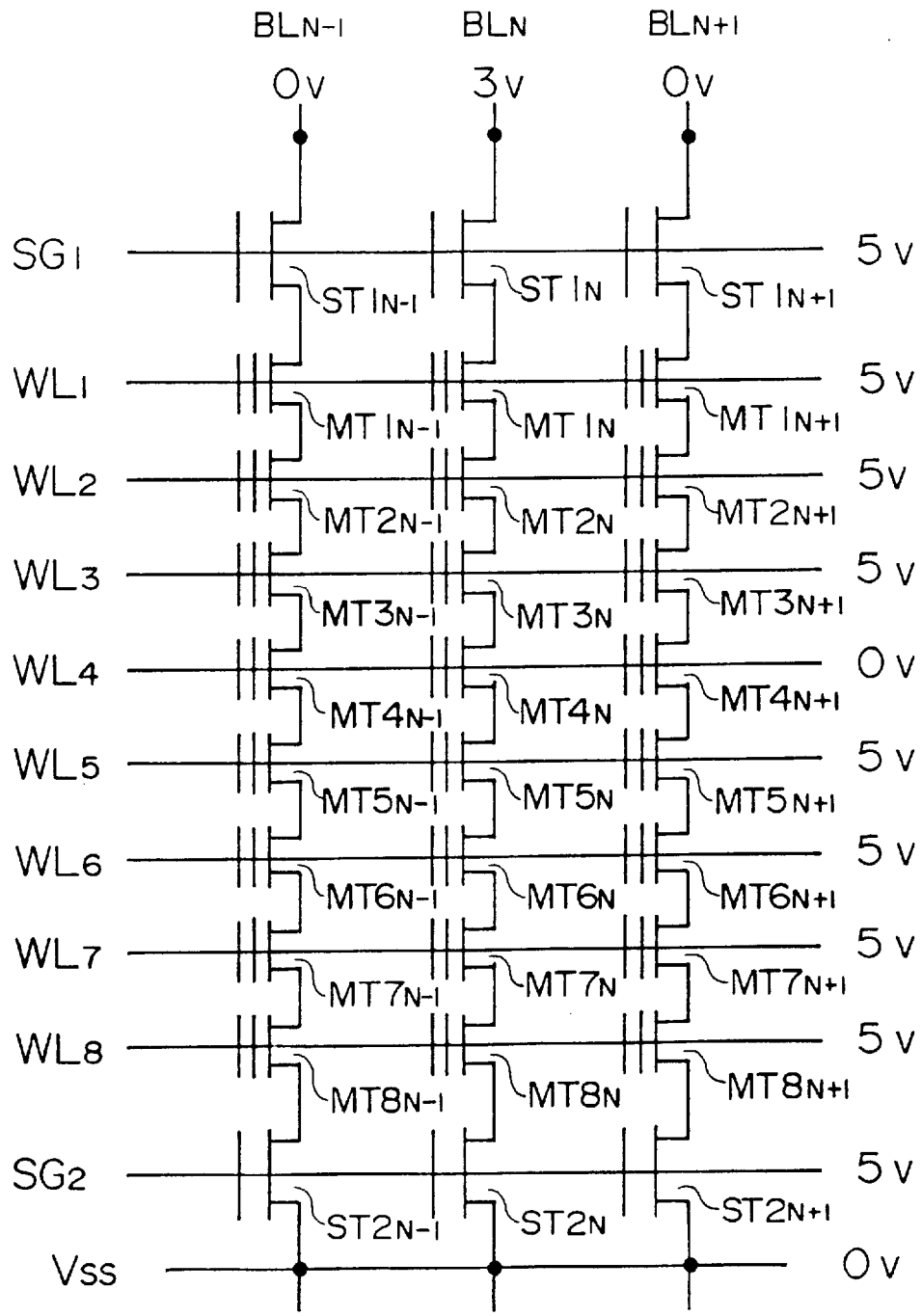
FIG. 1 is a circuit diagram showing an example of a memory cell array of a NAND type flash EEPROM and a view showing the bias conditions at the time of reading, as a related art.
Figures 2, 3, 4:
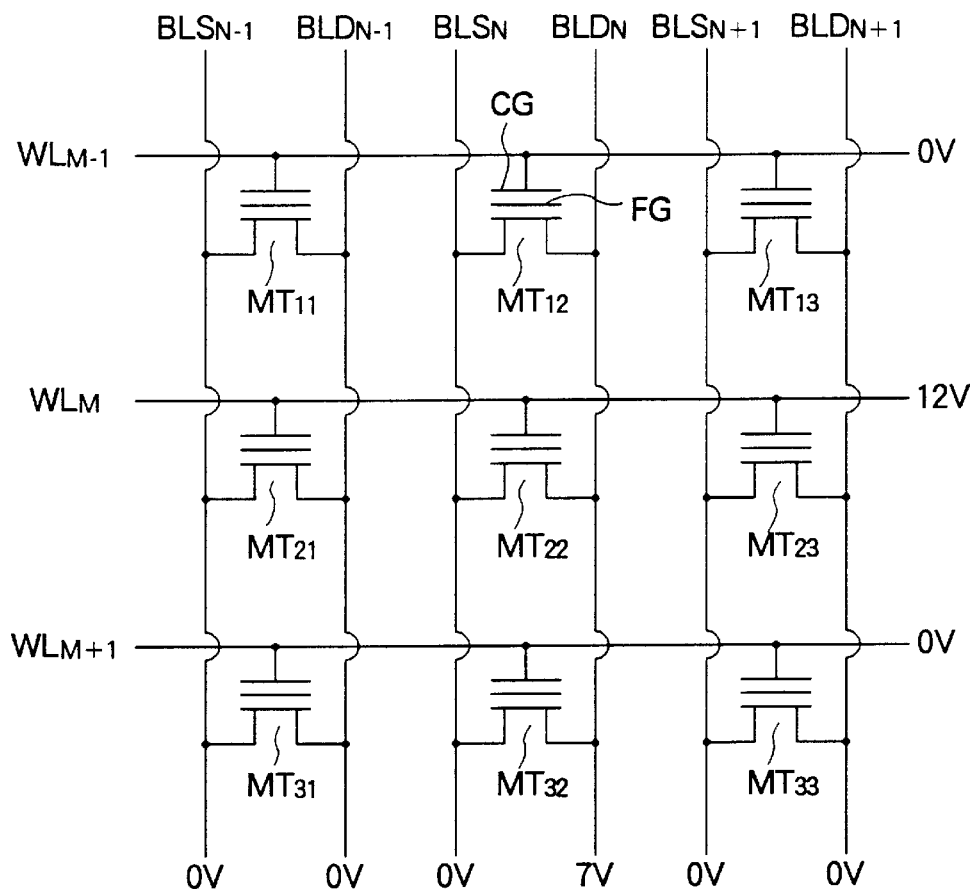
FIG. 2 is a view of the bias conditions at the time of reading of a memory cell array of the NAND type flash EEPROM of FIG. 1.
FIG. 3 is a circuit diagram showing an example of a memory cell array of a NOR type flash EEPROM and a view showing the bias conditions at, the time of writing by injection of channel hot electrons, as another related art.
FIG. 4 is a view of the bias conditions at the time of writing of a memory cell array of the NOR type flash EEPROM of FIG. 3.

After this, an overcoat layer is formed, pad electrodes are formed, and other final processes performed to complete an NAND type flash EEPROM of the circuit configuration shown in FIG. 4.

Note that in this embodiment, the bit lines 13 were comprised of aluminum, but of course they may also be comprised of other metals or other conductive materials.

As explained above, according to the present invention, in an NAND type flash EEPRON, an N-type impurity is implanted in a P-type channel portion to form a so-called buried channel structure and reduce the threshold voltage in the state of zero charge present in a floating gate, that is, the threshold voltage at the time of the state of erasure by ultraviolet light, from the usual 1 to 2 V to 0 to –1 V, so the amount of the positive charge in the state of the data "1" can be greatly reduced and the reading gate disturbance at the time of reading data can be mitigated.

Note that the present invention is not limited to the above embodiment and may be modified in various ways within the scope of the invention.

As explained above, according to the present invention, it is possible to prevent the occurrence of read gate disturbances at the time of reading data.

Figure 7:
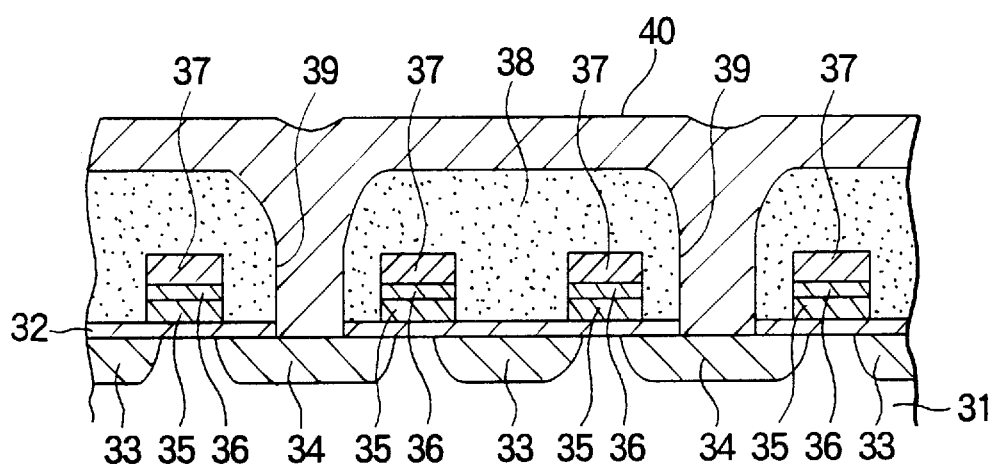
FIG. 7 is a cross-sectional view of a second embodiment of an NOR type flash EEPROM according to the present invention.

FIG. 7 is a cross-sectional view of a second embodiment as an NOR type flash EEPROM according to the present invention.

In FIG. 7, 31 represents a silicon substrate, 32 represents a tunnel oxide film, 33 represents a source diffusion layer, 34 represents a drain diffusion layer, 35 represents a floating gate polycrystalline silicon layer, 36 represents a polycrystalline silicon-polycrystalline silicon layer insulating film, 37 represents a control gate polycrystalline silicon layer, 38 represents a layer insulating film, 39 represents a bit line contact hole, and 40 represents an aluminum (Al) bit line.

In this flash EEPROM, for example, $B_+$ or $BF_2^+$ ions are implanted in the floating gate polycrystalline layers 35 of the memory cell transistors to form polycrystalline silicon gates with P-type impurities added. By this, the threshold voltage $V_{th}$ is made to be higher by the difference of the work functions with the N-type polycrystalline silicon and P-type polycrystalline silicon, that is, about 1 V or so.

The threshold voltage $V_{th0}$ at the time of the data "0" where positive charge is present in the floating gate FG of a memory cell is 1 to 2 V or so. On the other hand, the threshold voltage $V_{th1}$ at the time of the data "1" where a negative charge is present in the floating gate FG is at least 5 V.

Further, the threshold voltage $V_{THINIT}$ at the time where there is no charge in the floating gate FG is 2 to 3 V. That is, in this memory cell, the threshold voltage $V_{THINIT}$ in the state with no charge present in the floating gate is set, as shown below, between the threshold voltage $V_{th0}$ of the time of the data "0" where positive charge is present in the floating gate FG and the threshold voltage $V_{th1}$ at the time of the data "1" where a negative charge is present in the floating gate FG:

$$V_{th1} > V_{THINIT} > V_{th0}$$

In this way, by setting high the threshold voltage $V_{THINIT}$ at the time of the state of erasure by ultraviolet light from the usual 1 to 2 V or so to 2 to 3 V or so, the amount of the negative charge at the state of the data "1" is greatly reduced. As a result, the second term $[\alpha(V_{THINIT}-V_{TH})]$ in equation (2) mentioned above becomes much smaller and the writing gate disturbance at the time of writing data is greatly mitigated.

Next, an explanation will be made of the method of production of an NOR type flash EEPROM according to the present embodiment with reference to FIG. 7 and FIGS. 8A to 8I.

Figure 8A:
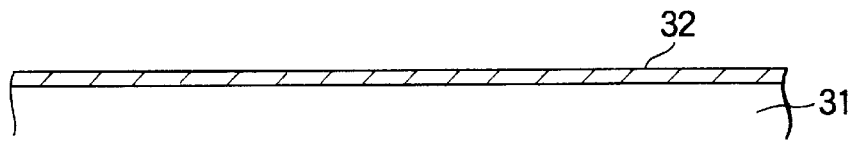
FIG. 8A to 8I are explanatory views of the process of production of a NOR type flash EEPROM according to the present invention.

First, as shown in FIG. 8A, a tunnel oxide film 32 of a thickness of 10 to 11 nm or so is formed by the heat oxidation method etc. on the silicon substrate 31.

Figure 8B:
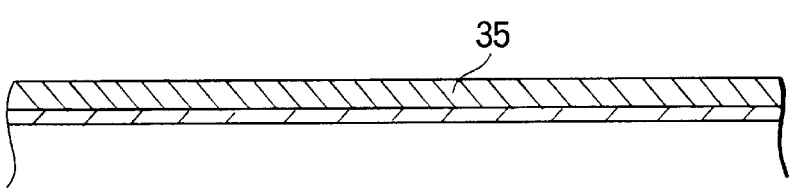

Next, as shown in FIG. 8B, a floating gate polycrystalline silicon layer 35 for forming the floating gates FG is formed on the tunnel oxide film 32 using polycrystalline silicon by for example the CVD method. The thickness of this floating gate polycrystalline silicon layer 35 is not particularly limited, but for example may be set to 100 to 200 nm or so.

Figure 8C:
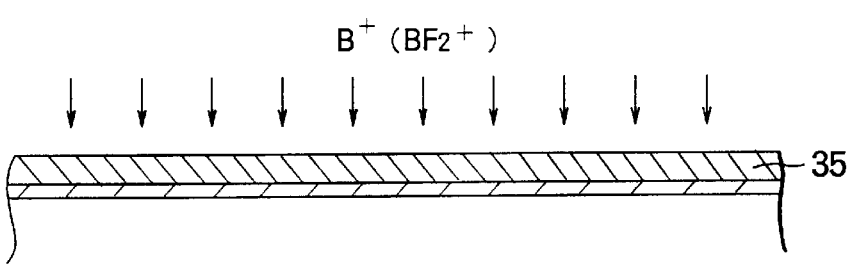

Next, as shown in FIG. 8C, $B^+$ ions or $BF_2^+$ ions are implanted in the floating gate polycrystalline silicon layer 35 to form polycrystalline silicon gates doped with a P-type impurity. By this, the threshold voltage $V_{th}$ becomes higher by the difference of work functions between the N-type polycrystalline silicon and P-type polycrystalline silicon or about 1 V or so.

Figure 8D:
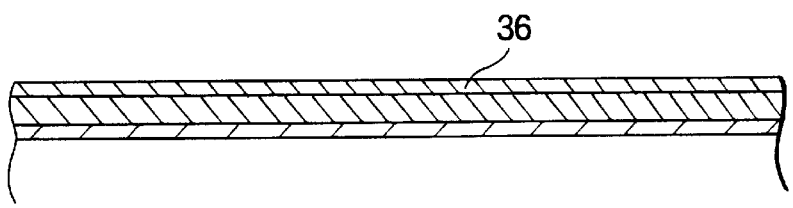

Next, as shown in FIG. 8D, the layer insulating film 36 is deposited on top. The layer insulating film 36 is not particularly limited, but for example use may be made of an ONO film ($SiO_2/SiN/SiO_2$ film). The ONO film is formed for example as follows:

First, the surface of the floating gate polycrystalline silicon layer 35 is heat oxidized to form an oxide film of not more than 14 nm or so. On this heat oxidized film is formed a silicon nitride film of not more than about 11 nm by the CVD method etc. This surface is heat oxidized to form an oxide film of not more than about 2 nm. By this processing, it is possible to form a three-layer structure ONO film. This ONO film is low in leakage current and superior in film thickness control. The thickness of the ONO film is not more than 22 nm or so converted to a silicon oxide film.

Figure 8E:
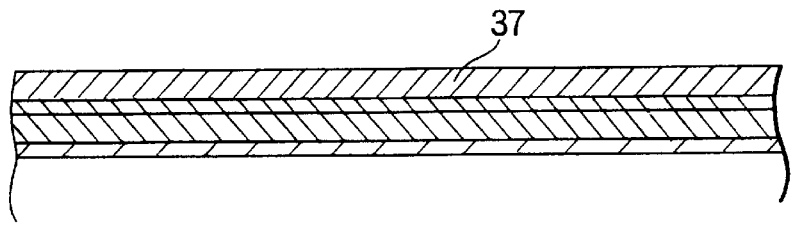

Next, as shown in FIG. 8E, a control gate polycrystalline silicon layer 37 for forming the control gates CG of the memory cell transistors is formed on the layer insulating film 36 using polycrystalline silicon and for example the CVD method. The thickness of this control gate polycrystalline silicon layer 37 is not particularly limited, but for example is set to not more than 200 nm.

Figure 8F:
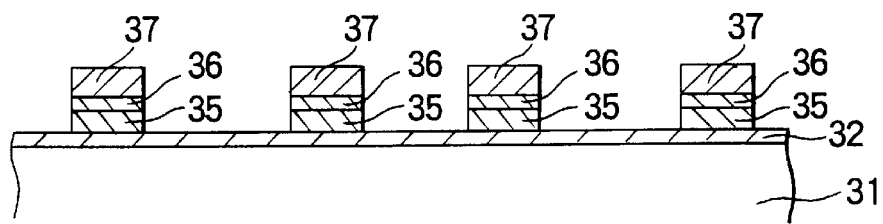

Next, as shown in FIG. 8F, the control gate polycrystalline silicon layer 37, the layer insulating film 36, and the floating gate polycrystalline silicon layer 35 are successively etched to obtain the portions of the control gate polycrystalline silicon layer 37, the layer insulating film 36, and the floating gate polycrystalline silicon layer 35 for each of the memory cells.

Figure 8G:
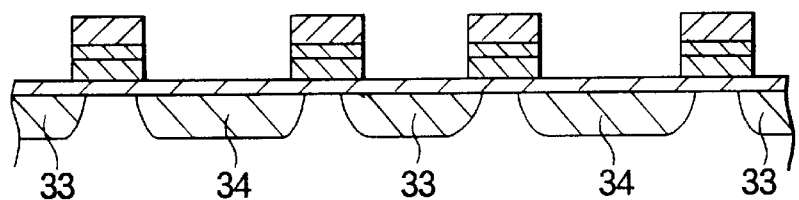

Next, as shown in FIG. 8G, use is made of the resist film (not shown) at the time of etching for N-type ion implantation on the surface of the silicon substrate 31 in a self-alignment manner with the memory cell transistors and thereby form the source diffusion layer 33 and drain diffusion layer 34.

Figure 8H:
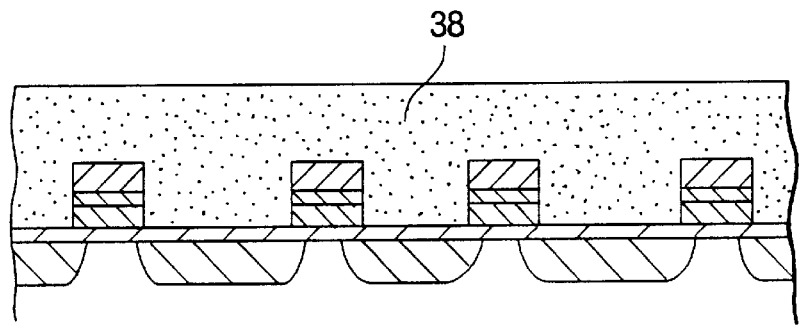

Next, as shown in FIG. 8H, a layer insulating film 38 is deposited by the CVD method or the like on the memory cell transistors. The layer insulating film 38 is comprised of for example a silicon oxide layer, silicon nitride layer, PSG layer, BPSG layer, etc. The thickness of the layer insulating film 38 is not particularly limited, but for example may be 200 to 300 nm.

Figure 8I:
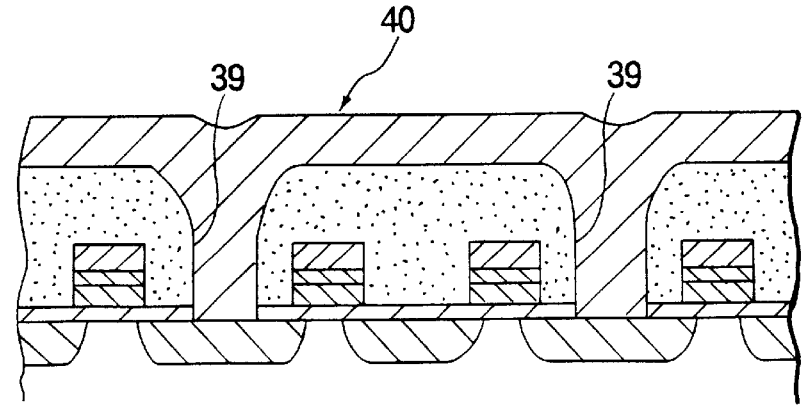

Next, as shown in FIG. 8I, the bit line contact holes 39 are formed in the layer insulating film 38 by etching or other means, then a conductive layer comprised of aluminum (Al) is deposited by sputtering etc. so as to enter into the contact holes 39.

Next, the conductive layer is etched to form the aluminum bit lines 40.

After this, an overcoat layer is formed, pad electrodes are formed, and other final processes performed to complete an NOR type flash EEPROM of the circuit configuration shown in FIG. 7.

Note that in this embodiment, the bit lines 40 were comprised of aluminum, but of course they may also be comprised of other metals or other conductive materials.

As explained above, according to the present invention, in an NOR type flash EEPRON, a P-type impurity is implanted in a floating gate polycrystalline silicon layer 35 to raise the threshold voltage in the state of zero charge present in a floating gate, that is, the threshold voltage at the time of the state of erasure by ultraviolet light, from the usual 1 to 2 V to 2 to 3 V, so the amount of the negative charge in the state of the data "1" can be greatly reduced and the write gate disturbance at the time of writing data can be mitigated.

Note that the present invention is not limited to the above embodiment and may be modified in various ways within the scope of the invention.

As explained above, according to the present invention, it is possible to prevent the occurrence of writing gate disturbances at the time of writing data.

What is claimed is:

1. A semiconductor nonvolatile memory device having reduced write disturbance, comprising:
    (a) a plurality of memory transistors, each memory transistor including;
        a silicon substrate;
        a tunnel oxide film formed on said silicon substrate;
        a source diffusion layer formed on said silicon substrate and forming a source electrode of said memory transistor;
        a drain diffusion layer formed on said silicon substrate and forming a drain electrode of said memory transistor;
        a floating gate polycrystalline silicon for forming a floating gate electrode and for storing charge and changing a threshold voltage of said memory transistor according to a data, said floating gate polycrystalline silicon is formed on said tunnel oxide film between said source diffusion layer and said drain diffusion layer;
        an insulating film formed on said floating gate polycrystalline silicon;
        a control gate polycrystalline silicon for forming a control gate electrode of said memory transistor formed on said insulating film;
    (b) a plurality of word lines, wherein each said word line is connected to a respectively associated control gate electrode of one of said memory transistors;
    (c) a plurality of bit lines, wherein each said bit line is connected to a respectively associated drain electrode of one of said memory transistors;
    (d) a plurality of source lines, wherein each said source line is connected to a respectively associated source electrode of one of said memory transistors; and
    (e) wherein said plurality of memory transistors are arranged in a matrix of said plurality of word lines and said plurality of bit lines, wherein said memory transistors are connected to the same bit line are arranged in a parallel connection between said same bit line and source line;
    wherein a P-type impurity is introduced in said floating gate polycrystalline layer of each said memory transistor whereby the threshold voltage of said memory transistor with zero charge present in the floating gate is raised by the difference between the work function of N-type floating gate polycrystalline silicon and the work function of P-type floating gate polycrystalline silicon generally on the order of 1 V.

2. A semiconductor nonvolatile memory device as set forth in claim 1, wherein the threshold voltage of each said memory transistor with no charge present in the floating gate is in a range of positive voltage.

3. A semiconductor nonvolatile memory device as set forth in claim 1, wherein said P-type impurity introduced in said floating gate polycrystalline silicon is implanted B+ or BF+ ion.

4. A semiconductor nonvolatile memory device with reduced write disturbance comprising:

(a) a plurality of memory transistors, each memory transistor including;
a silicon substrate;
a tunnel oxide film formed on said silicon substrate;
a source diffusion layer formed on said silicon substrate and forming a source electrode;
a drain diffusion layer formed on said silicon substrate and forming a drain electrode;
a floating gate polycrystalline silicon for forming a floating gate electrode and for storing charge and changing a threshold voltage, said floating gate polycrystalline silicon is formed on said tunnel oxide film between said source diffusion layer and said drain diffusion layer;
an insulating film formed on said floating gate polycrystalline silicon;
a control gate polycrystalline silicon for acting as a control gate electrode formed on said insulating film;

(b) a plurality of word lines, wherein each said word line is connected to a respectively associated control gate electrode of one of said memory transistors;

(c) a plurality of bit lines, wherein each said bit line is connected to a respectively associated drain electrode of one of said memory transistors;

(d) a plurality of source lines, wherein each said source line is connected to the source electrode of a respectively associated memory transistor; and (e) a memory array which is constituted of a plurality of said memory transistors arranged in a matrix of said plurality of word lines and said lines are arranged in parallel connection between said same bit line and source line;

wherein a P-type impurity is introduced in said floating gate polycrystalline layer of each said memory transistor whereby the threshold value with zero charge present in the floating gate is between a threshold value in the state of writing and a threshold value in a state of erasure.

5. A semiconductor nonvolatile memory device as set forth in claim 4, wherein said P-type impurity introduced in said floating gate polycrystalline silicon is implanted B+ or BF2+ ion.

* * * * *